US006774061B2

(12) United States Patent
Coffa et al.

(10) Patent No.: US 6,774,061 B2
(45) Date of Patent: Aug. 10, 2004

(54) NANOCRYSTALLINE SILICON QUANTUM DOTS WITHIN AN OXIDE LAYER

(75) Inventors: Salvatore Coffa, Tremestieri Etneo (IT); Davide Patti, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 72 days.

(21) Appl. No.: 09/811,159

(22) Filed: Mar. 15, 2001

(65) Prior Publication Data

US 2002/0017657 A1 Feb. 14, 2002

(30) Foreign Application Priority Data

Mar. 15, 2000 (EP) .............................. 00830197

(51) Int. Cl.⁷ ........................ H01L 21/336; H01L 21/31
(52) U.S. Cl. ...................... 438/962; 438/197; 438/764; 438/783
(58) Field of Search ............................ 437/24, 28, 29, 437/241; 438/264, 301; 257/315, 316

(56) References Cited

U.S. PATENT DOCUMENTS

| | | | |
|---|---|---|---|
| 4,162,176 A | | 7/1979 | Tsuda .......................... 148/1.5 |
| 5,852,346 A | * | 12/1998 | Komoda et al. .......... 315/169.3 |
| 5,959,896 A | | 9/1999 | Forbes .................... 365/185.33 |
| 6,060,743 A | * | 5/2000 | Sugiyama et al. ............. 257/12 |

FOREIGN PATENT DOCUMENTS

| EP | 0 069 233 | 1/1983 |
|---|---|---|
| EP | 0 342 778 | 11/1989 |

OTHER PUBLICATIONS

Hanafi et al., Fast and Long Retention Time Nanocrystal Memory, Sep. 9, 1996, IEEE, vol. 43, p. 1553–1558.*
Normand et al., Formation of 2–D Arrays of Silicon Nanocrystals in Thin SiO2 Films by Very–Low Energy Si Ion Implantation, Feb. 26, 1998, Electorchemical and Solid State Letters, p. 88–90.*
Normand, P. et al., "Formation of 2–D Arrays of Silicon Nanocrystals in Thin Sio₂ Films by Very–Low Energy Si⁺ Ion Implantation," *Electrochemical and Solid State Letters*, 1(2):88–90, 1998.

* cited by examiner

*Primary Examiner*—Carl Whitehead, Jr.
*Assistant Examiner*—David L. Hogans
(74) *Attorney, Agent, or Firm*—Lisa K. Jorgenson; E. Russell Tarleton; SEED IP Law Group PLLC

(57) ABSTRACT

A process for forming a thin layer of Silicon nanocrystals in an oxide layer is disclosed. The process includes, on a semiconductive substrate, thermally oxidizing a first portion of the substrate into an oxide layer, forming Silicon ions within the layer of oxide, and thermally treating the Silicon ions to become the thin layer of Silicon nanocrystals. In the inventive process the formation of the Silicon ions is by ionic implantation of the Silicon ions into the oxide at an ionization energy of between 0.1 keV and 7 keV, and preferably between 1 and 5 keV. This allows the Silicon atoms to coalesce in a lower temperature than would otherwise be possible. Additionally, more than one layer of nanocrystals can be formed by performing more than one implantation at more than one energy level. Embodiments of the invention can be used to form non-volatile memory devices with a very high quality having a very small size.

12 Claims, 3 Drawing Sheets

5 KeV S$_1$, 5E16/cm2

5 KeV S$_1$, 2E 6/cm2

NANOCRYSTALLINE SILICON QUANTUM DOTS WITHIN AN OXIDE LAYER

TECHNICAL FIELD

The present invention is directed toward forming a series of nanocrystalline silicon quantum dots within a thin oxide layer, and, more particularly, to a process for forming the nanocrystalline quantum dots using a lower processing temperature than in previous processes.

BACKGROUND OF THE INVENTION

Advanced electronics and opto-electronic devices can be fabricated using carrier confinement and Coulomb blockage effects of a layer of nanometer-sized Silicon crystals, commonly referred to as Si quantum dots.

References in the area of Si quantum dots include *Nanotechnology*, Gregory Timp, Editor, Springer-Verlag, New York (1999) (and references contained within); as well as *A Silicon nanocrystals Based Memory*, S. Tiwari et al., Appl. Phys. Lett. 68, 1377 (1996); *The Integration of Nanoscale Porous Silicon Light Emitters: Materials Science, Properties and Integration with Electronic Circuitry*, P. M. Fauchet, Journal of Luminescence 80, 53 (1999); and *Room-Temperature Single-Electron Memory*, K. Yano et al., IEEE Trans. on Electronic Devices ED-41, 1628 (1994).

One area of electronics using Si quantum dots to a great success is the formation of non-volatile memory devices. In such devices, a layer of Si quantum dots within a thin dielectric layer, such as a gate oxide, is used in place of the more typical structure of an entire polysilicon layer (floating gate) formed within a thicker oxide. Examples of non-volatile memories formed by nanocrystalline silicon include U.S. Pat. Nos. 5,852,306 and 5,959,896, the teachings of which are incorporated herein in their entirety.

Additionally, light emitting Silicon devices are being produced with a layer of Si nanocrystals that are embedded within a Silicon Dioxide layer.

Forming the Si nanocrystals can be achieved by a variety of techniques, such as plasma-enhanced vapor deposition, aerosol techniques, or Si implantation, for example.

Several strict requirements must be met for a successful use of Si quantum dots in most applications. First, it is necessary that a localized layer of small (1–3 nanometer in diameter) Si nanocrystals that have a very uniform size distribution be formed within a very thin (10–40 nm) layer of Silicon Dioxide ($SiO_2$) that has excellent electronic properties. Second, the density of defect states at the interface between the Si nanocrystals and the $SiO_2$ must be minimal. Finally, the thermal temperature of the processing or annealing step should be as low as possible.

This last requirement, that of a low processing temperature, can be crucial in many applications. In particular, for this application, the nanocrystal array should be formed with a thermal process at temperatures below 1000° C. High temperatures are not compatible with the fabrication flow of advanced devices. These high temperatures are therefore to be avoided, to the extent possible.

Until now, the only method by which this goal can be achieved is by depositing amorphous Silicon and crystallizing it into polysilicon at 750° C., as disclosed in the K. Yano et al. article cited above. However, this method creates a discontinuous polysilicon layer, and the thickness variations in the film makes reproducibility and control of the process quite critical.

On the other hand, alternative methods using Silicon rich oxide layers that are produced by deposition of a substechiometric oxide layer, require a thermal process at a temperature above 1050° C. in order to form the Si nanocrystals through the agglomeration of the excess Silicon.

Thus, in the prior art there is no controlled process whereby the necessary processes can be performed in a low thermal environment. Therefore, until now, there was no method available for implanting Silicon ions into a thin oxide layer such that a subsequent thermal processing step can be performed within a low thermal budget that ensures that the Silicon ions are implanted at a precise depth, such that no over lateral or horizontal dispersion occurs.

SUMMARY OF THE INVENTION

Embodiments of the present invention implant Silicon ions by ion implantation at a low energy into a thin oxide layer, such that annealing needed for the formation of the nanocrystal can be performed within a low thermal budget. Additionally, Silicon ions implanted at such a low energy level have low incidence of horizontal or lateral dispersion. In some embodiments, ultra-low energy Silicon ion implantation successfully introduces Si ions in an oxide layer to produce a localized layer of Si nanocrystals in a process that is easily integrated with existing semiconductor fabrication processes.

Presented is a process for forming an oxide layer containing either a continuous polysilicon layer or a series of quantum dots. The process includes forming the oxide layer on a semiconductive substrate. Silicon ions are then introduced within the oxide layer by ionic implantation of the Silicon ions at a low energy level. Next the semiconductive substrate is thermally treated to cause the Silicon ions to become either the continuous polysilicon layer, or the series of quantum dots, depending on how the thermal treatment is performed. In some embodiments the energy of the implanted ions is between 0.1 and 7 keV.

Also presented is a method of forming a non-volatile memory device using the above methods to fabricate a floating gate.

The characteristics and advantages of the device according to the invention will be seen from the description, following herein, of an embodiment given as an indication and not limiting with reference to the drawings attached.

DETAILED DESCRIPTION OF THE PREFERRED EMBODIMENTS

A repeatable process that creates uniform, small-sized and high density Si quantum dots in thin oxides or other tunneling oxides is disclosed.

Figure 1A:
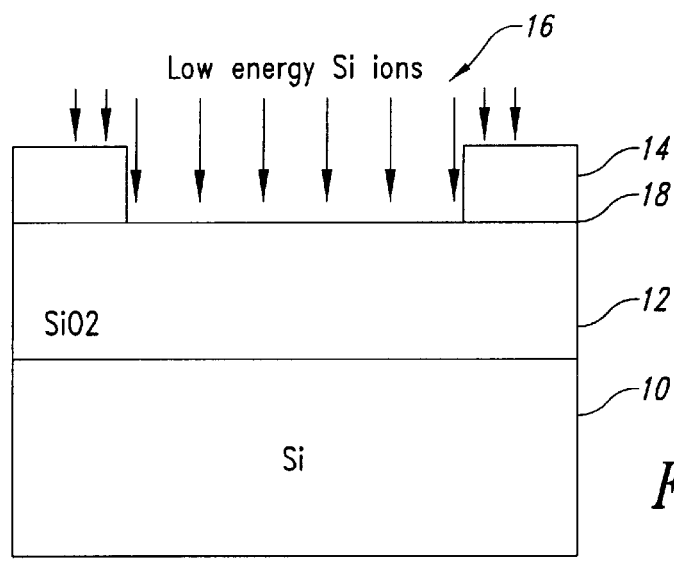
FIGS. 1*a*, 1*b* and 1*c* are cross-sectional diagrams of an exemplary silicon wafer showing steps in a process according to an embodiment of the invention.
Figure 1B:
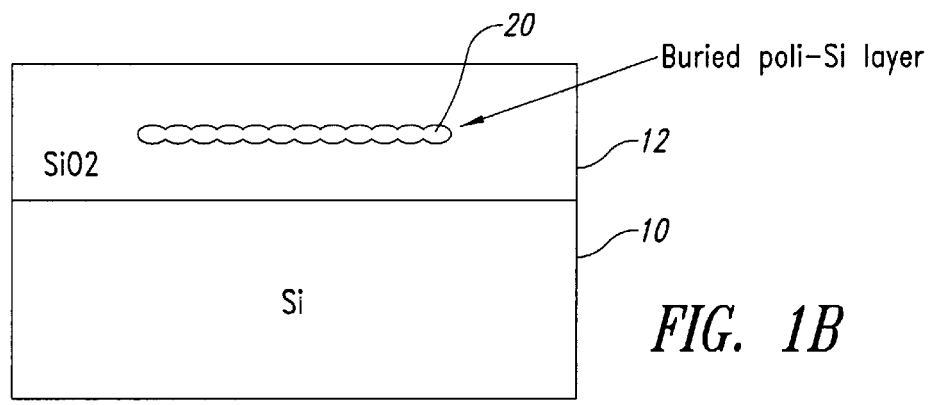
Figure 1C:
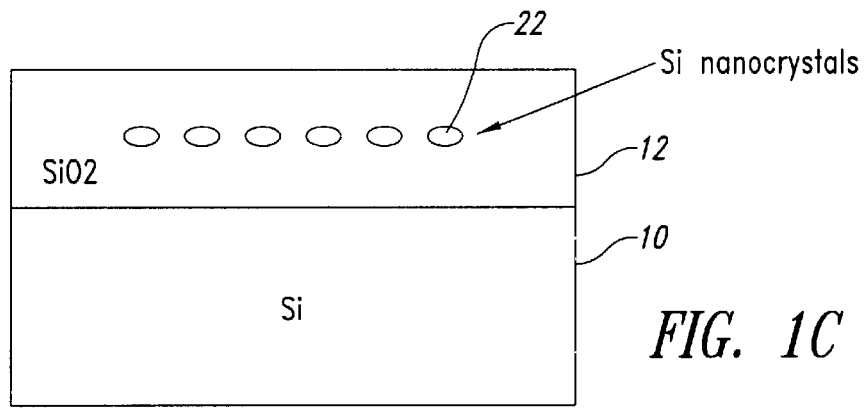

With reference to FIGS. 1*a*, 1*b*, and 1*c*, the example used to describe the inventive process is that of forming Si quantum dots in a thermally grown $SiO_2$ gate oxide. It is clear, however, to those skilled in the art that this method can be used for the formation of dots with other materials (such as for example Ge, Sn, Au, etc.) into various dielectric films (oxides, nitrides, etc.) either grown or deposited on semiconductor or even other materials. Discussion of structures or processes well known to those skilled in the art has been abbreviated or eliminated for brevity.

The use of ion implantation at traditional energies (i.e., higher than 20 keV) for the synthesis of localized arrays of Si nanocrystals presents two major problems. First, the implanted ions are largely dispersed, about 14 nm for a 20 keV Si implant, which produces a broad depth (i.e., vertical) distribution of the excess Si. This results in a broad depth distribution of the nanocrystals formed when the Si quantum dots are thermally treated. Second, because the diameter of a Si quantum dot can only grow by accumulating excess Si atoms in a volume of radius $\sqrt{Dt}$ around the nucleus (where D is the diffusion coefficient of Silicon at the annealing temperature, and where t is the annealing time), crystallization will only take place when the temperature is above a critical value. In the prior art solutions, implanting the Silicon ions at the high energy implant causes a large spatial distribution of ions, i.e., they are not very close to one another after implantation. Because D is very small (i.e., approx. $10^{-16}/cm^2$ even at 1100° C.) and because in these prior art solutions the distance between implanted Silicon ions is relatively large, temperatures above 1000° C. are needed in order to form nanocrystals with 1–3 nm size. Therefore, this high thermal process can only be used in semiconductor fabrications where exposure to a high temperature will not damage the circuitry being formed. Third, the broad distribution of the excess Silicon ions results in both broad lateral and depth distribution of the nanocrystals formed after the thermal process.

These above problems prevent prior art circuits from performing at the optimum levels possible. On the contrary, in embodiments of the present invention, the use of extremely low energy (<5 keV) Si ion implantation results in an extremely narrow implanted ion concentration profile. For example, a 1 keV Si ion implanted into $SiO_2$ has a projected depth range of only approx. 5 nm and a lateral dispersion of only 1.5 nm.

Furthermore, due to the reduced dispersion, extremely high peak Si concentration is achieved. For example, a peak concentration of $5 \times 10^{22}/cm3$, corresponding to the atomic density of bulk Silicon, is achieved by a 1 KeV Si implant to a fluence (i.e., the number of implanted atoms per square area of silicon) of $2 \times 10^{16}/cm2$.

In these conditions, the growth and hence the crystallization of the agglomerates are dominated by the coalescence of the high density of smaller Si aggregates found at the ion end of the range, rather than being limited by the long range diffusion of the Silicon ions.

This produces a considerable reduction in the required thermal budget, or the overall time and temperature of the finishing steps that require heat treatment. In particular, nanograins (small portions of agglomed Silicon) have been found to be already formed in temperatures as low as 700° C.

This low energy implantation forms a buried polysilicon layer within the oxide layer.

With reference to FIG. 1a, shown is a Silicon semiconductor substrate 10, on which a Silicon Dioxide layer 12 has been grown. In a standard masking step, a layer of energy-sensitive material, such as a photoresistive layer is deposited on the Silicon Dioxide layer 12. After partially covering, exposing and developing this photoresistive layer, remaining on the Silicon Dioxide layer 12 is a implantation block 14, a portion of which is shown in FIG. 1a, and an opening 16 is formed in the implantation block. Low energy Silicon ions are implanted into the Silicon Dioxide layer 12 through the opening 16 at an energy between 0.1 keV and 10 keV, with energy levels between about 1 and 5 keV being preferred. At this energy, the Silicon ions are driven into the Silicon Dioxide layer 12 at a very specific location, between a top surface 18 and the junction of the substrate 10 with the Silicon Dioxide layer 12. Controlling the implantation energy determines where the Silicon ions will be placed in the Silicon Dioxide layer 12. Also, at these low implantation energies, the Silicon ions are very localized, and do not disperse much in either a horizontal or vertical direction. In other words, the Silicon ions, after being implanted by the low implantation energy, are closely grouped.

FIG. 1b shows an embodiment of the invention where a buried polysilicon layer 20 is formed within the Silicon Dioxide layer 12. After the Silicon ions have been implanted into the Silicon Dioxide layer 12, the structure is heated at a low temperature, for instance 700–800° C., causing excess Silicon ions to fuse into the buried polysilicon layer 20.

FIG. 1c shows an embodiment of the invention where a nanocrystal array 22 is formed within the Silicon Dioxide layer 12. In this embodiment, after the Silicon ions have been implanted, the structure is heated to a low temperature, for instance 700–800° C., in the presence of an oxidizing agent such as an ambient atmosphere containing $N_2$ and $O_2$. Again the vertical and lateral dispersion of the Silicon ions is very low when the Silicon ions are implanted at low energy levels. The heating of the structure causes the Silicon ions to group together in clusters, thereby forming an array of nanocrystals 22 at the desired location within the Silicon Dioxide layer 12.

Figure 2A:
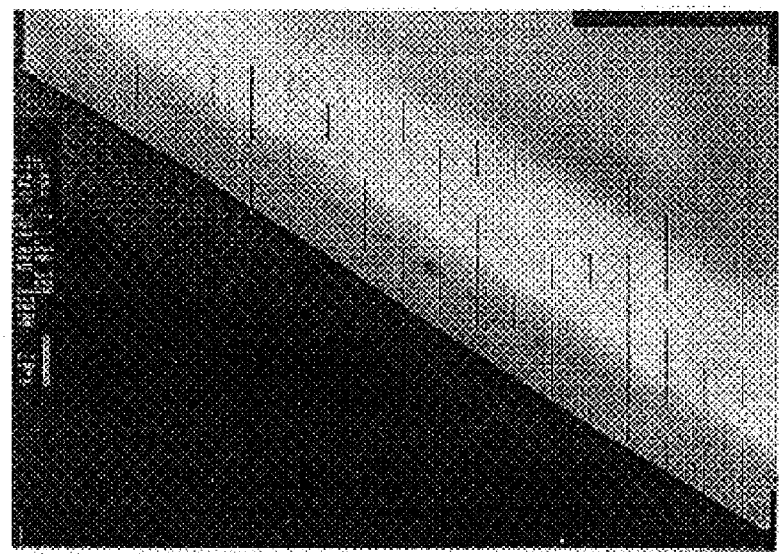
FIGS. 2*a* and 2*b* are drawings of electron microscopy photographs showing Silicon ions that were implanted in a Silicon Dioxide layer according to embodiments of the invention.

FIG. 2a is a drawing of a scanning electron microscope photograph that shows the actual results of Si quantum dots implanted into a Silicon Dioxide layer that is about 25 nm thick. In this embodiment the Silicon ions were implanted at an energy of 5 keV and a fluence of $5 \times 10^{16}/cm^2$ into the Silicon Dioxide layer. After thermal treatment, the resultant continuous polysilicon layer is 5 nm thick.

Figure 2B:
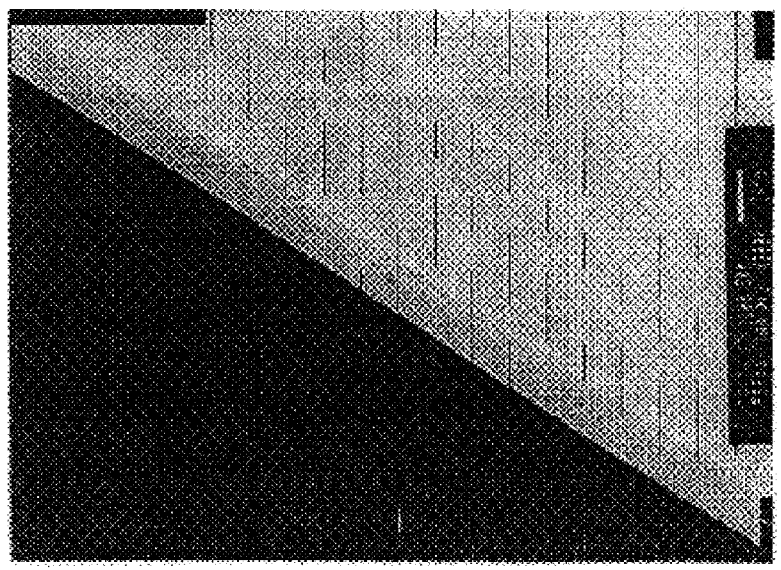

FIG. 2b shows the actual results of Si quantum dots implanted into a Silicon Dioxide layer that is about 15 nm thick. In this embodiment, the Silicon ions were implanted at an implantation energy of 1 keV and a fluence of $2 \times 10^{16}/cm^2$. Subsequent thermal treatment with oxidation produces a dense array of small (1.5 nm in diameter) Si nanocrystals having a very localized position.

The depth of the buried Silicon layer is determined by the projected range of the ions (which can be changed from about 2 nm for implants at 0.2 keV to about 10 nm for implants at 5 keV. Note that the polysilicon layer is fully confined within the $SiO_2$ layer even for an extremely thin layer of oxide. No interaction of the excess Silicon with either surface or $Si/SiO_2$ interface has been observed.

The grain size in the layer, and hence the maximum dimension of the Si nanocrystals in the polysilicon layer is determined by the lateral diffusion of the ion distribution which can be as small as about 3 nm for a 1 keV implant.

These continuous polysilicon layers can be transformed into well localized arrays of Silicon nanocrystals by performing a low temperature (e.g. 800° C. for 1 hour) oxidation in a $N_2+O_2$ ambient atmosphere. The process results in a preferential oxidation along the grain boundary, and hence in the separation of the various grain. The final array consists of well localized nanocrystals with a sharp grain size distribution.

Figure 3:
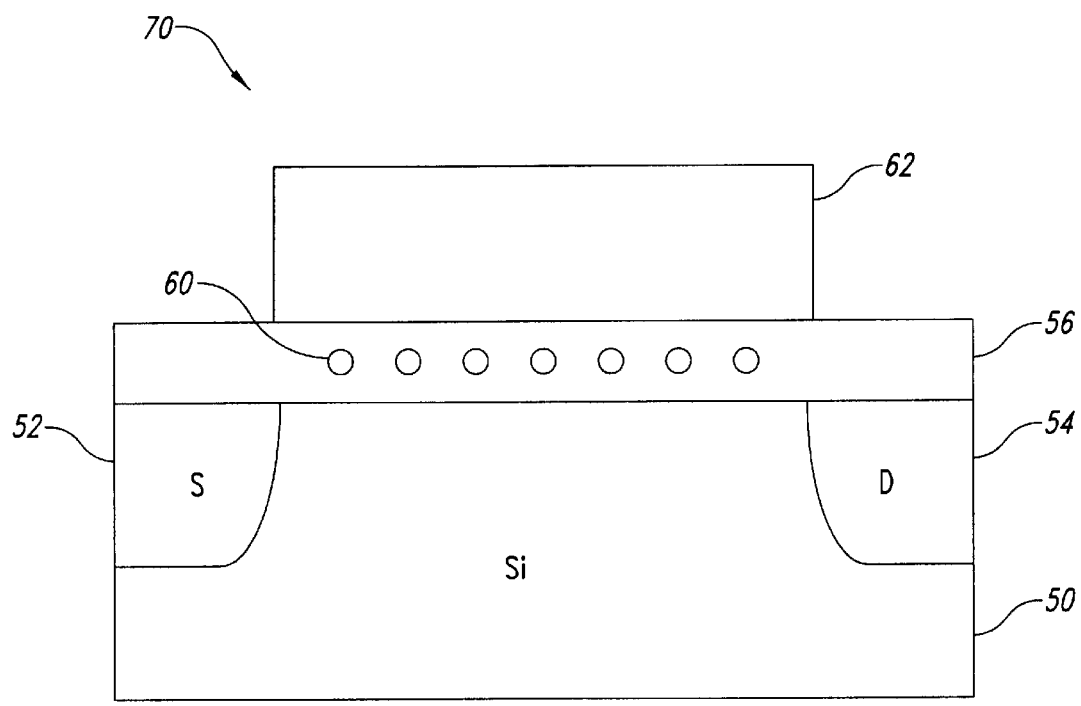
FIG. 3 is a cross sectional diagram of an exemplary floating gate memory cell formed by the process described with reference to FIGS. 1*a*, 1*b*, and 1*c*.

FIG. 3 shows an example of a non-volatile memory cell 70 produced using one of the inventive processes. In a Silicon semiconductor substrate 50, a source 52 and a drain 54 are conventionally produced. A thin Silicon Dioxide layer 56 is grown on the semiconductor substrate 50. A mask is formed on the Silicon Dioxide layer 56 and an opening produced within the mask (mask and opening not shown). The opening roughly approximates the distance between the source 52 and the drain 54 in this example. Silicon ions are implanted into the Silicon Dioxide layer 56 and then thermally treated in an oxidizing environment to produce an array of nanocrystals 60. The size and depth of the nanocrystal array will depending on the energy of implantation and the number of Silicon ions implanted.

After the nanocrystal array has been established, a Polysilicon gate layer 62 is formed on the Silicon Dioxide layer 56. Of course, the source 52 and the drain 54 can be formed before or after the growing of the Silicon Dioxide layer 56, or even after the formation of the Polysilicon gate layer 62.

Many advantages are afforded by embodiments of this invention in comparison with the prior art techniques. Low energy ion implantation is an extremely reliable process able to be used in the advanced formation of semiconductor circuits with little modification of existing processes. The low energy ion implantation is a clean process, and does not introduce any contaminates such as Nitrogen and Hydrogen which are found when a plasma-assisted process is used. Presence of these contaminates degrades device performance.

Nanocrystals that are fully embedded in a thermally grown oxide can be formed, thus achieving a perfect interface between the nanocrystals and the $SiO_2$ matrix. This cannot be achieved by the other prior art methods since the thermal treatments of non-stechiometric oxides results in Si nanocrystals embedded in a $SiO_x$ matrix. Non-stechiometric oxides are used in plasma-enhanced chemical vapor deposition and in other methods.

The dimensions of the nanocrystals can be carefully controlled by lateral ion diffusion which is extremely low at energies below 1 keV. This ensures that the Si nanocrystals having diameters as small as 1 to 2 nm can be regularly formed.

Using a thermal process following ion implantation can guarantee a process dominated by the nucleation rather than diffusion-mediated growth. Hence, the energy and diffusion of the implant can be used to fix the location of the array of Si quantum dots and the average dimension of the dots.

The process is easily assimilated into the current state of the art production techniques. For example, it can be patterned by using implants through a mask, thus solving the problems encountered in the etching of thin Silicon-rich films.

Either a continuous polysilicon layer or a distributed array of Silicon nanocrystals can be formed by properly changing the ion fluence. Additionally, more than one separate layer can be formed by performing multiple ion implantations having different energies.

The dimensions of the quantum dots can be controlled by only changing the ion fluence and the thermal treatments.

One non-limiting example of application is the fabrication of advanced nonvolatile memories in which the continuous floating gate is replaced by an array of Si quantum dots. The potential innovation in this structure (which has been proposed by K. Yano et al., and by S. Tiwari et al., both cited above) in terms of operation voltage and programming times, can be fully explored only if a reliable technology for the fabrication of nanometer scale dots with high throughput and good uniformity in size and positions is available. Such technology is afforded by embodiments of the invention.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims and the equivalents thereof.

What is claimed is:

1. A process for forming an oxide layer containing a continuous polysilicon layer comprising:

forming the oxide layer on a semiconductive substrate;

introducing Silicon ions within the oxide layer by ionic implantation of the Silicon ions into the oxide layer at a low energy level under 20 keV and a fluence of about $5 \times 10^{16}$ $cm^{-2}$; and thermally treating the semiconductive substrate at a temperature of between 700 and 800° C. to cause the Silicon ions to become the continuous polysilicon layer.

2. The process of claim 1 wherein the oxide layer is thermally grown to a thickness of between 15 and 40 nm prior to being implanted.

3. The process of claim 1 wherein the energy level of the ionic implantation is between 0.1 and 7 keV.

4. The process of claim 1 comprising transforming the continuous polysilicon layer into an array of Silicon nanocrystals by performing oxidation at a temperature in the range of 700° C. to 800° C. for at least one hour in an atmosphere of $N_2+O_2$.

5. A process for forming a distributed array of Silicon nanocrystals a controlled distance from a first top surface of a Silicon Dioxide layer and a second controlled distance from a second bottom surface of the Silicon Dioxide layer, the process comprising:

forming a Silicon Dioxide layer on the Silicon substrate;

forming a masking layer disposed on the Silicon Dioxide layer;

forming at least one opening in the masking layer;

implanting Silicon ions through the at least one opening in the masking layer and into the Silicon Dioxide layer by ionic implantation at an ionization energy of between 0.1 keV and 7 keV and a fluence of about $2 \times 10^{16}$ $cm^2$; and thermally treating the silicon substrate at a temperature between 700 and 800° C. to cause the implanted Silicon ions to become the distributed array of Silicon nanocrystals.

6. The process of claim 5 wherein controlling the first controlled distance and the second controlled distance comprises changing the ion implantation energy levels.

7. The process of claim 5 further comprising forming a second distributed array of Silicon nanocrystals by ionic implantation of further Silicon ions at another low ionization energy that is different than the ionization energy of the first implantation.

8. A process for forming an oxide layer containing a layer of Silicon nanocrystals, comprising:

forming the oxide layer on a semiconductor substrate;

introducing Silicon ions into the oxide layer by ionic implantation having a fluence of about $2 \times 10^{16}/cm^2$ at an ionization energy of approximately 1 keV; and thermally treating the semiconductor substrate at about 700° C. to cause the Silicon ions to form into the Silicon nanocrystals.

9. The process according to claim 8, further comprising introducing a second set of Silicon ions into the oxide layer by ionic implantation having an ionization energy different than approximately 1 keV.

10. A process for forming a non-volatile memory device comprising:

thermally oxidizing a first portion of a semiconductive substrate into a tunnel oxide;

forming a masking layer on the tunnel oxide;

forming an opening in the masking layer;

depositing Silicon ions into the layer of tunnel oxide through the opening in the masking by ionic implanting the Silicon ions into the tunnel oxide at an ionization energy of between 0.1 keV and 7 keV and a fluence of about $2 \times 10^{16}$ cm$^2$;

thermally treating the Silicon ions at a temperature between 700 and 800° C. to become a thin layer of Silicon nanocrystals;

forming source and drain regions in the substrate; and forming a control gate disposed over the tunnel oxide.

11. The process of claim 10 wherein thermally treating the Silicon ions is in the presence of an oxidizing agent.

12. The process of claim 11 wherein the thermal treatment of the Silicon ions is performed in a Nitrogen atmosphere.

* * * * *